United States Patent [19]

Kleyer

[11] Patent Number: 4,864,967

[45] Date of Patent: Sep. 12, 1989

[54] BAND COATING APPARATUS

[75] Inventor: Siegfried Kleyer, Hainburg, Fed. Rep. of Germany

[73] Assignee: Leybold-Aktiengesellschaft, Hanau am Main, Fed. Rep. of Germany

[21] Appl. No.: 143,356

[22] Filed: Jan. 12, 1988

[30] Foreign Application Priority Data

Nov. 14, 1987 [DE] Fed. Rep. of Germany ....... 3738722

[51] Int. Cl.$^4$ ...................... C23C 16/54; C23C 16/56
[52] U.S. Cl. ................................... 118/718; 118/719; 118/722
[58] Field of Search ............... 118/718, 722, 724, 719; 427/178

[56] References Cited

U.S. PATENT DOCUMENTS 4,220,117  9/1980  Shinohara ........................... 118/718

Primary Examiner—Evan Lawrence
Attorney, Agent, or Firm—Felfe & Lynch

[57] ABSTRACT

In an apparatus for the coating of bands on both sides with zinc in a vacuum, consisting of a housing (32) surrounding a coating chamber (28) and a winding chamber (45), a removable cover disposed on at least one side of the housing (32) for the hermetic closure of the coating chamber and winding chamber (28, 45), a winding system with rotatably mounted pulley rolls, guide rolls and tension rolls (5 to 17), with coating rolls (18, 53) and a take-up roll and supply roll (35', 37') and with coating sources (19, 54) disposed in the coating chamber, a tube (33) leading into the winding chamber (45) is provided for the introduction of a gas which prevents any sticking of the coated band (50) on the take-up roll (35').

5 Claims, 1 Drawing Sheet

BAND COATING APPARATUS

BACKGROUND OF THE INVENTION

1. Field of the Invention

The invention relates to an apparatus for vacuum-coating bands or webs, having a housing around a coating chamber and a winding chamber, having a removable cover on at least one side of the housing for the hermetic closure of the chambers, and having a winding apparatus with rotatably mounted pulley rolls, guide rolls and tension rolls and at least one coating roll and a take-up roll and a supply roll, as well as at least one coating source held fixedly in the housing.

2. Discussion of Related Art

With the known coating apparatus it is possible to coat one side of plastic bands, plastic films (e.g., OPP films) and even paper webs, with zinc. Coating with zinc on two sides, however, is not possible with these apparatus, because when the zinc coatings lie face to face when they are wound up, the material or films or bands will block up or stick together, with the result that after coating on both sides the band or the film can no longer be pulled or unrolled from the take-up roll without damage to the coatings.

It is therefore the aim of the present invention to improve the coating apparatus of the kind in question such that any sticking of the coatings on the take-up roll after the coating process will be prevented.

SUMMARY OF THE INVENTION

This aim is achieved according to the invention by the fact that a passage or tube leading into the winding chamber is provided for the introduction of a gas, preferably oxygen or nitrogen.

Preferably, the tube for the introduction of the gas discharges the gas at one end, in the area of the take-up roll, and is connected at the other end to a tank containing gas under pressure. A gas feeding device, such as a valve for example, being is inserted into the tube.

The tube is preferably brought through a hermetic seal in the wall of the housing or cover and provided at its free end with a nozzle by which the gas is directed against the band or coil running from the coating roll to the take-up roll.

To prevent an excessively rapid distribution of the gas introduced into the interior of the housing of the apparatus, the gas flowing through the tube into the interior of the housing passes into a chamber separated by baffles from the coating chamber.

It is desirable for the take-up roll to be situated in the chamber defined by the baffles, so that the gas will act on the deposited coatings especially in the moment in which the band or film runs onto the take-up roll.

DETAILED DESCRIPTION OF THE PREFERRED EMBODIMENT

Figure 2:
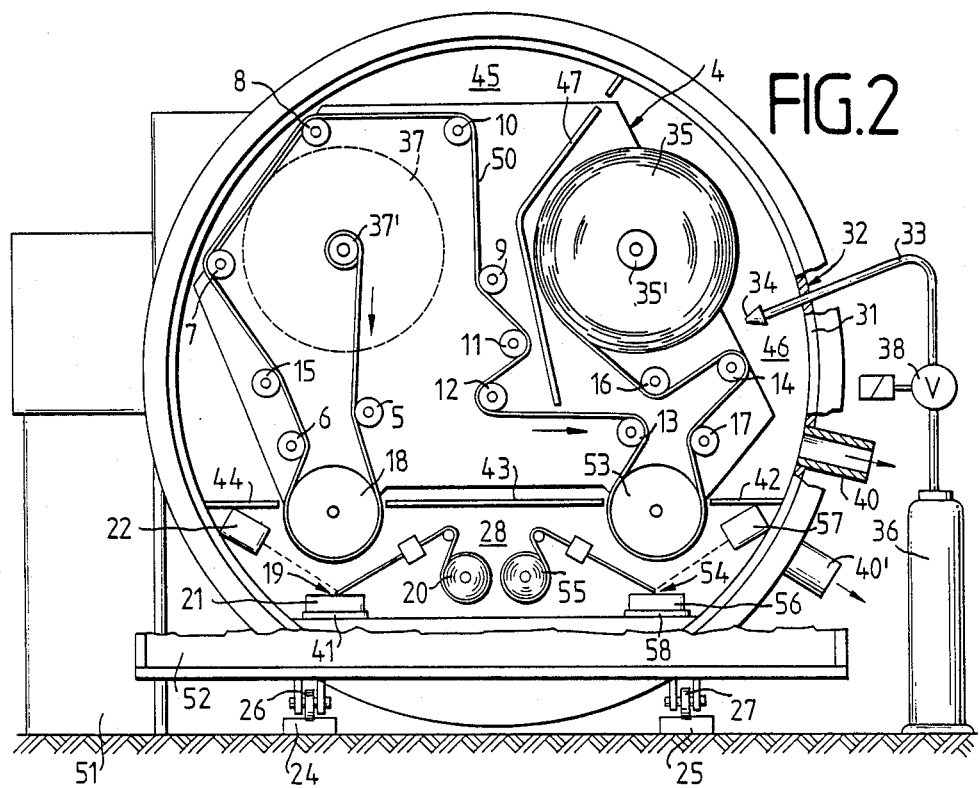
FIG. 2 is a front view of the apparatus according to FIG. 1, in a cross section along lines A-B in FIG. 1, some of the pulley rolls and tension rolls represented in FIG. 1 being omitted from the FIGURE for the sake of simplicity.
Figure 1:
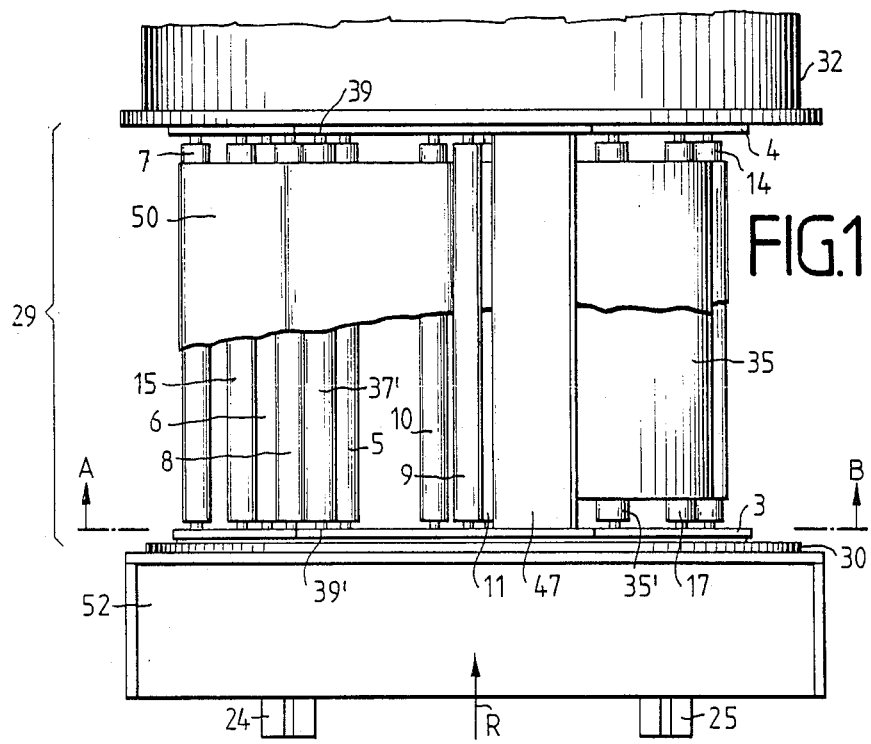
FIG. 1 is a top view of a portion of the band coating apparatus whose winding apparatus has been rolled out of the hollow cylindrical coating chamber to be loaded.

The band coating apparatus consists essentially of the pulley rolls, tension measuring rolls, tightening rolls and tension rolls 5 to 17, the cooled coating cylinders 18 and 53, the supply roll 37 and the take-up roll 35, the evaporation sources 19 and 54 which are disposed in the coating chamber 28 formed by a hollow cylinder 32, with aluminum wire spools 20 and 55 and the evaporation trays 21 and 56, as well as two television cameras 22 and 57 for observing the coating process. The two end plates 3 and 4 can be rolled into and out of the winding chamber 45 in the direction of the arrow R, together with the rolls 5 to 17 and the coating rolls 18 and 53 which form the winding system. When the winding system 29 is rolled into the housing the marginal portion of the cover disk 30 is applied against the flange-like end surface 31 of the hollow cylinder 32 where it is held against the end surface 31 of the hollow cylinder 32 by clamps which are not shown or by the depression below atmospheric pressure prevailing during the working phase in the winding chamber 45 and coating chamber 28.

The band coating apparatus is moreover provided with a tube 33 whose apparatus end bears a nozzle 34; the tube is connected to a gas tank 36 and brought through the wall of the hollow cylindrical housing 32 in the area 46 of the take-up roll 35. A valve 38 is inserted into the tube and serves for the regulation of the flow of the gas through the tube 33 and its discharge from the nozzle 34.

To place the band coating apparatus in operation, first a supply roll 37 with its core 37' is hung in the bearings 39 and 39' in the end plates 3 and 4, and the band to be coated is threaded in the manner represented in FIG. 2 over the rolls 5 to 17 and over the coating rolls 18 and 53 to the take-up roll core 35' to which it is fastened. Then the entire winding apparatus 29 can be rolled in the direction of the arrow R into the hollow cylindrical housing 32 until the cover 30 sealingly engages the end surface 31. After the supporting frame 52 has been locked in its working position the chambers 28 and 45 can be evacuated of air through the suction pump connections 40 and 40'. After a predetermined working pressure is reached the heating units 41 and 58 of the evaporation sources 19 and 54 can be activated, so that evaporated metal (e.g., zinc) issues from the evaporation trays 21 and 56 and can precipitate on the band 50 in the area of the cooled coating rolls 18 and 53. At the same time various rolls, and especially the take-up roll 35', can be made to rotate by motors not represented in the drawing, so that the band runs from the supply roll 37' past the evaporation sources 19 and 54 to the take-up roll 35', while being uniformly coated on both sides. In order to prevent any sticking of the various layers of the band 50 on the take-up roll 35, a gas, nitrogen for example, can be blown onto the band 50 after valve 38 is opened.

I claim:

1. Apparatus for coating a layer on both sides of a web in a vacuum, said apparatus comprising:
    means for coating one side of said web;
    means for coating the opposed side of said web;
    a winding chamber having a take-up roll therein for winding the web after it is coated on both sides; and means for introducing a gas into said winding chamber and directing said gas aganist said web after it is coated.

2. Apparatus according to claim 1 wherein said means for introducing and directing said gas includes a tube connecting said winding chamber with a pressurized gas tank through a gas controlling device.

3. Apparatus according to claim 2 further comprising a nozzle at the end of said tube, said nozzle adapted to aim the gas against the web as the web runs to the take-up roll.

4. Apparatus according to claim 1 further comprising a coating chamber in which said means for coating said web are located, said winding chamber being separated from said coating chamber by baffles.

5. Apparatus according to claim 4 wherein the take-up roll is separated by baffles from a roll that supplies the web wound on said take-up roll.

* * * * *

UNITED STATES PATENT AND TRADEMARK OFFICE
CERTIFICATE OF CORRECTION

PATENT NO. : 4,864,967

DATED : September 12, 1989

INVENTOR(S) : Siegfried Kleyer

It is certified that error appears in the above-identified patent and that said Letters Patent is hereby corrected as shown below:

Column 1, line 42, "being" should be deleted.

Signed and Sealed this

Twenty-third Day of October, 1990

Attest:

HARRY F. MANBECK, JR.

*Attesting Officer*          *Commissioner of Patents and Trademarks*